United States Patent
Takeda et al.

(10) Patent No.: US 10,128,128 B2
(45) Date of Patent: Nov. 13, 2018

(54) METHOD OF MANUFACTURING SEMICONDUCTOR DEVICE HAVING AIR GAP BETWEEN WIRINGS FOR LOW DIELECTRIC CONSTANT

(71) Applicant: HITACHI KOKUSAI ELECTRIC INC., Tokyo (JP)

(72) Inventors: Tsuyoshi Takeda, Toyama (JP); Hiroshi Ashihara, Toyama (JP); Naofumi Ohashi, Toyama (JP); Toshiyuki Kikuchi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/460,557

(22) Filed: Mar. 16, 2017

(65) Prior Publication Data
US 2017/0287731 A1 Oct. 5, 2017

(30) Foreign Application Priority Data
Mar. 30, 2016 (JP) .................................. 2016-068140

(51) Int. Cl.
*H01L 21/44* (2006.01)
*H01L 21/48* (2006.01)
(Continued)

(52) U.S. Cl.
CPC ...... *H01L 21/4857* (2013.01); *H01L 21/7685* (2013.01); *H01L 21/76819* (2013.01);
(Continued)

(58) Field of Classification Search
CPC ........... H01L 21/4857; H01L 21/76834; H01L 21/7685; H01L 21/768
See application file for complete search history.

(56) References Cited

U.S. PATENT DOCUMENTS 8,122,405 B2 2/2012 Matsumoto et al.
8,420,528 B2 4/2013 Noguchi
(Continued)

FOREIGN PATENT DOCUMENTS

JP 2008-147516 A 6/2008
JP 2009-016790 A 1/2009
(Continued)

OTHER PUBLICATIONS

Office Action in counterpart TW Application No. 106102982 dated Nov. 17, 2017.
(Continued)

*Primary Examiner* — Ismail Muse
(74) *Attorney, Agent, or Firm* — Volpe and Koenig, P.C.

(57) ABSTRACT

A method of manufacturing a semiconductor device includes: (a) loading into a process chamber a substrate including: a wiring layer including a first interlayer insulating film, a plurality of copper-containing films formed on the first interlayer insulating film and used as a wiring, an inter-wire insulating film electrically insulating the plurality of copper containing film and a recess formed between the plurality of copper-containing film; and a first diffusion barrier film formed on a first portion of a surface of the plurality of copper-containing films to suppress a diffusion of a component of the plurality of copper-containing film; and (b) supplying a silicon-containing gas into the process chamber to form a silicon-containing film on: a surface of the recess; and a second portion of the surface of the plurality of copper-containing films other than the first portion where the first diffusion barrier film is formed.

5 Claims, 10 Drawing Sheets

(51) Int. Cl.
  *H01L 21/768* (2006.01)
  *H01L 23/522* (2006.01)
  *H01L 23/532* (2006.01)

(52) U.S. Cl.
  CPC .... *H01L 21/76834* (2013.01); *H01L 23/5222* (2013.01); *H01L 23/5329* (2013.01); *H01L 23/53295* (2013.01); *H01L 23/53238* (2013.01)

(56) References Cited

U.S. PATENT DOCUMENTS

| | | | |
|---|---|---|---|
| 8,586,447 B2 | 11/2013 | Noguchi et al. | |
| 9,698,050 B1* | 7/2017 | Ashihara | H01L 21/76879 |
| 2001/0049203 A1* | 12/2001 | Kim | C23C 16/30 |
| | | | 438/778 |
| 2006/0186549 A1* | 8/2006 | Usami | H01L 21/3143 |
| | | | 257/762 |
| 2007/0066083 A1* | 3/2007 | Yang | B82Y 10/00 |
| | | | 438/764 |
| 2008/0135849 A1 | 6/2008 | Yamayoshi | |
| 2008/0299763 A1* | 12/2008 | Ueki | H01L 21/7682 |
| | | | 438/627 |
| 2009/0305480 A1 | 12/2009 | Sasahara et al. | |
| 2013/0014699 A1* | 1/2013 | Okazaki | C23C 14/02 |
| | | | 118/718 |
| 2014/0080319 A1* | 3/2014 | Sasajima | C23C 16/30 |
| | | | 438/778 |
| 2014/0235067 A1* | 8/2014 | Shimamoto | C23C 16/36 |
| | | | 438/763 |
| 2014/0287595 A1* | 9/2014 | Shimamoto | H01L 21/02126 |
| | | | 438/774 |
| 2015/0072537 A1* | 3/2015 | Noda | H01L 21/02126 |
| | | | 438/786 |
| 2016/0240428 A1* | 8/2016 | Tung | H01L 21/7682 |

FOREIGN PATENT DOCUMENTS

| | | |
|---|---|---|
| JP | 201249290 | 3/2012 |
| JP | 20161760 | 1/2016 |
| TW | 201017819 A1 | 5/2010 |

OTHER PUBLICATIONS

Office Action in JP counterpart Application No. 2016-068140 dated Sep. 13, 2017.

\* cited by examiner

US 10,128,128 B2

METHOD OF MANUFACTURING SEMICONDUCTOR DEVICE HAVING AIR GAP BETWEEN WIRINGS FOR LOW DIELECTRIC CONSTANT

CROSS-REFERENCE TO RELATED PATENT APPLICATION

This non-provisional U.S. patent application claims priority under 35 U.S.C. § 119 of Japanese Patent Application No. 2016-068140, filed on Mar. 30, 2016, the entire contents of which are hereby incorporated by reference.

BACKGROUND

1. Field

The present disclosure relates to a method of manufacturing semiconductor device.

2. Description of the Related Art

As semiconductor devices are integrated at high density, the distance between wirings also decreases. When the electrical capacitance between the wirings increases due to the reduction of the distance between the wirings, the propagation speed of the signal becomes slower. Therefore, it is necessary that the dielectric constant between wirings be as low as possible.

An air gap structure, that is, a structure having a recess between wirings, has been developed as one of the methods for reducing the dielectric constant. For example, an air gap, i.e. a recess, may be formed between the wirings.

Misalignment may occur in accordance with the problem of processing precision when patterning is performed. When misalignment occurs, the characteristics of the circuit may deteriorate.

SUMMARY

Described herein is a technique capable of providing superior characteristics in a semiconductor device having an air gap.

According to one aspect, a technique is provided that includes a method of manufacturing a semiconductor device, the method including: (a) loading into a process chamber a substrate including: a wiring layer including a first interlayer insulating film, a plurality of copper-containing films formed on the first interlayer insulating film and used as a wiring, an inter-wire insulating film electrically insulating the plurality of copper containing film and a recess formed between the plurality of copper-containing film; and a first diffusion barrier film formed on a first portion of a surface of the plurality of copper-containing films to suppress a diffusion of a component of the plurality of copper-containing film; and (b) supplying a silicon-containing gas into the process chamber to form a silicon-containing film on: a surface of the recess; and a second portion of the surface of the plurality of copper-containing films other than the first portion where the first diffusion barrier film is formed.

DETAILED DESCRIPTION

Hereinafter, embodiments will be described with reference to the drawings.

First Embodiment

The first embodiment is described below.

Some of the manufacturing steps of the semiconductor device will be described with reference to FIG.

<Wiring Layer Forming Step S101>

Figure 1:
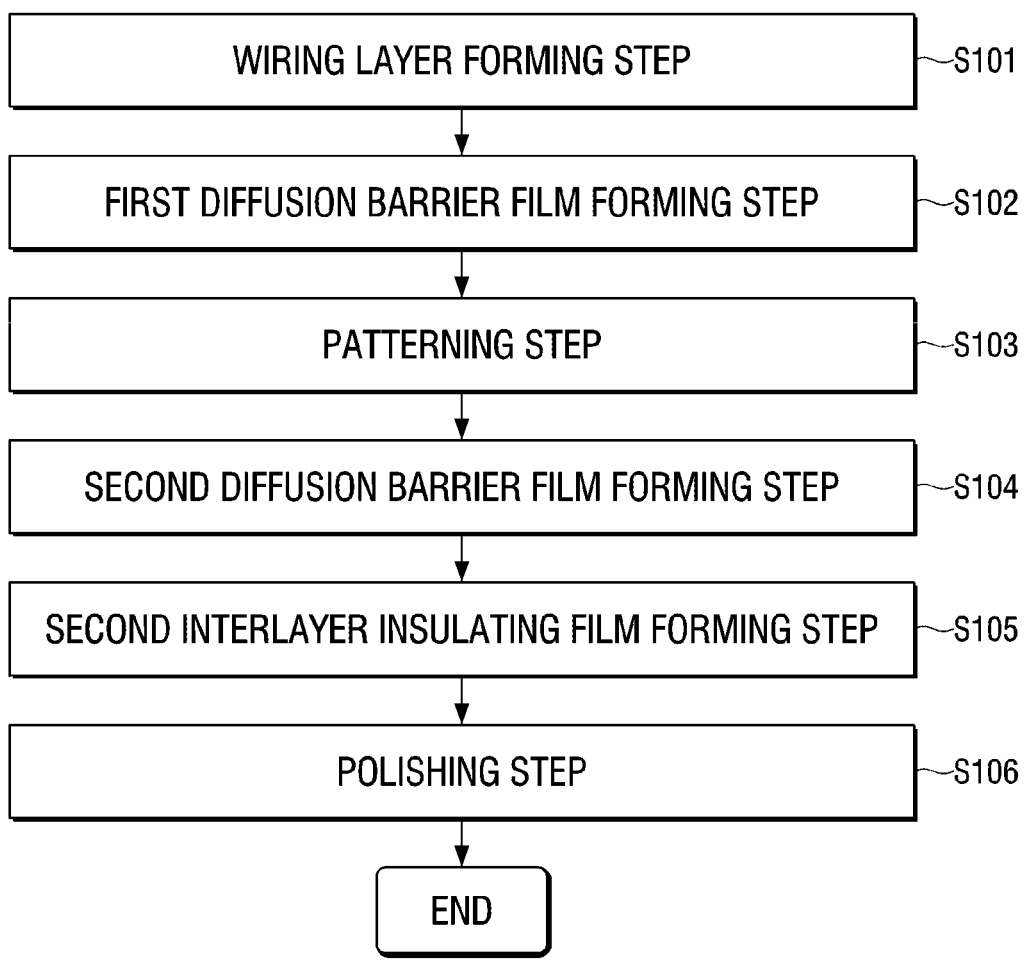
FIG. 1 is a flow chart illustrating a method of fabricating a semiconductor device according to a first embodiment.
Figure 2:
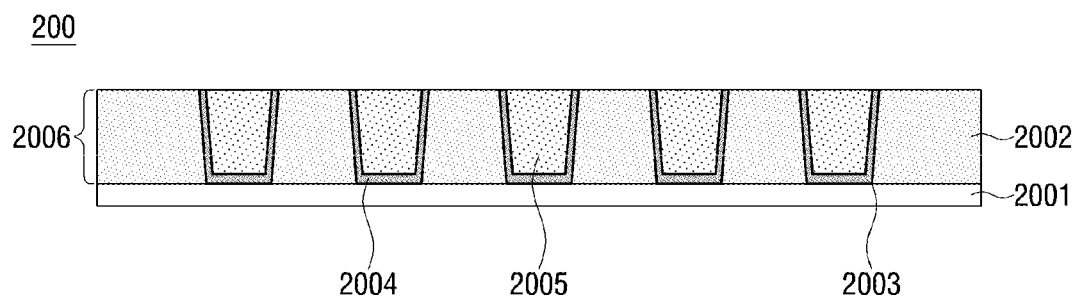
FIG. 2 illustrates a wafer according to the first embodiment.

The wiring layer forming step S101 will be described with reference to FIG. 2. FIG. 2 illustrates a wiring layer 2006 formed on a semiconductor wafer, i.e. a wafer 200. The wiring layer 2006 is formed on an insulating film 2001. An electrode layer (not shown) is disposed below the insulating film 2001. A gate electrode and an anode are provided in the electrode layer. The insulating film 2001 is used as an interlayer insulating film between the electrode layer and the wiring layer 2006.

The insulating film 2001 includes, for example, a porous carbon-containing silicon film (also referred to as "SiOC film"). An inter-wire insulating film 2002 is formed on the insulating film 2001. The inter-wire insulating film 2002 includes, for example, a SiOC film.

Grooves 2003 are provided in the inter-wire insulating film 2002. A barrier film 2004 is formed on the surface of the groove 2003. The barrier film 2004 includes, for example, tantalum nitride film (TaN film). A copper-containing film 2005 is formed on the barrier film 2004 and used as a wiring. The copper-containing film 2005 is made of, for example, copper.

After the copper-containing film 2005 is formed, the wafer 200 is subjected to a CMP (Chemical Mechanical Polishing) process. FIG. 2 illustrates the wafer 200 with the extra copper-containing film 2005 removed. Referring to FIG. 2, the space between carbon-containing films 2005 formed in the grooves 2003 is insulated.

In the first embodiment, the layer including the interlayer insulating film 2002, the groove 2003, the barrier film 2004 and the copper-containing film 2005 is referred to as a first wiring layer 2006. In the first embodiment, the wiring layer located above the first wiring layer is referred to as a second wiring layer (not shown).

<First Diffusion Barrier Film Forming Step S102>

Figure 3:
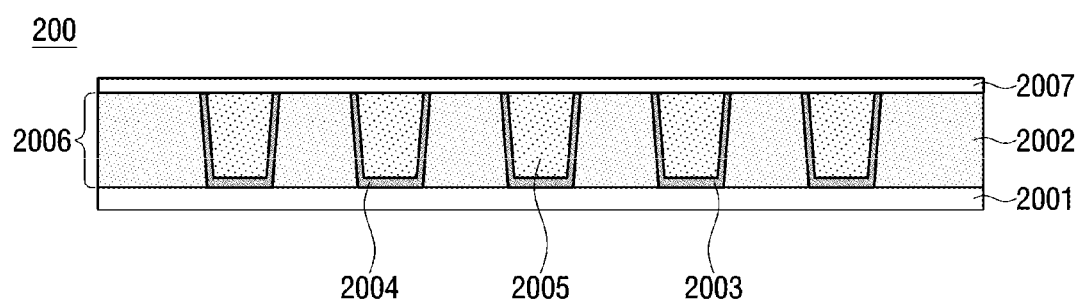
FIG. 3 is a view illustrating a wafer processing state according to the first embodiment.

Next, the first diffusion barrier film forming step S102 will be described with reference to FIG. 3. In the first diffusion barrier film forming step S102, a first diffusion barrier film 2007 is formed on the wafer 200 having the wiring layer 2006 of FIG. 2. The first diffusion barrier film 2007 includes, for example, a SiON film. The first diffusion barrier film 2007 has properties of insulation and suppressing diffusion. Specifically, by forming the first diffusion barrier film 2007, the components contained in the copper-containing film 2005 may be prevented from diffusing into an upper layer. When the spacing between the wirings is significantly narrow, adjacent wirings (copper-containing film 2005) may be electrically short-circuited due to the upper layer formed on the wiring layer 2006. The first diffusion barrier film 2007 may suppress the wiring from being electrically short-circuited.

<Patterning Step S103>

Figure 4A:
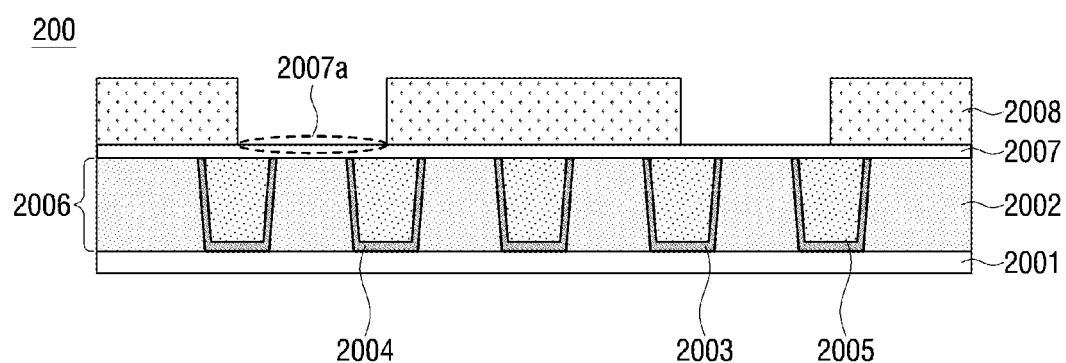
FIG. 4A is a view illustrating a wafer processing state according to the first embodiment.
Figure 4B:
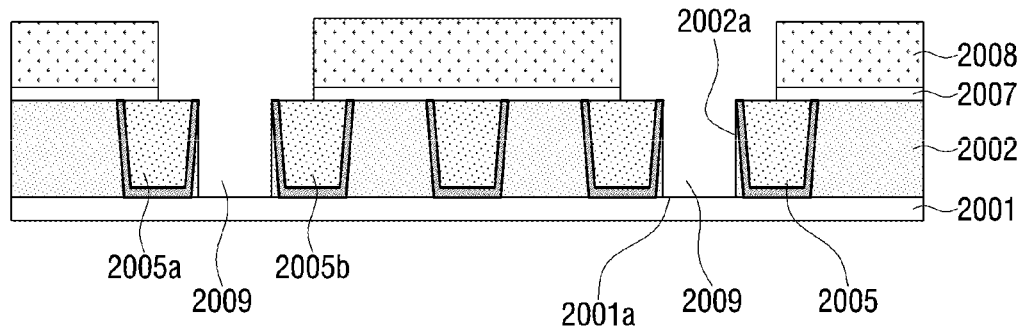
FIG. 4B is a view illustrating a wafer processing state with a portion of an inter-wire insulating film etched according to the first embodiment.

Next, the patterning step S103 will be described. In the patterning step S103, the wafer 200 having the first diffusion barrier film 2007 shown in FIG. 3 is patterned as shown in FIGS. 4A and 4B. First, a photoresist layer (not shown) for patterning is formed on the first diffusion barrier film 2007. Next, the wafer 200 is exposed and developed to form a photoresist layer pattern 2008 as shown in FIG. 4A.

After the photoresist layer pattern 2008 is formed, the wafer 200 is etched. As shown in FIG. 4B, a portion of the inter-wire insulating film 2002 is etched to form a recess 2009 between the carbon-containing films 2005. For example, a recess 2009 is formed between a carbon-containing film 2005a and a carbon-containing film 2005b. The recess 2009 is used as an "air gap" in the process described below. The recess 2009 is a space defined by a surface 2001a of the insulating film 2001 and a side surface 2002a of the inter-wire insulating film 2002.

The photoresist layer pattern 2008 is removed after the recess 2009 is formed.

The air gap will be described below. In recent years, the distance between wirings becomes narrower due to miniaturization and densification of semiconductor devices.

As semiconductor devices are miniaturized and integrated at high density, the distance between the wirings also decreases. When the distance between the wirings decreases, the electrical capacitance between the wirings increases and the signal delay occurs. Conventionally, the gap between the wirings is filled with insulating material having low dielectric constant in order to overcome these problems. However, there is physical limitation in reducing the dielectric constant by filling the gap with insulating material. Therefore, by forming a recess (air gap) between the wirings, the dielectric constant is lowered.

<Second Diffusion Barrier Film Forming Step S104>

Recently, the miniaturization and densification of semiconductor devices have resulted in the reduced distance between wirings. Since the exposure accuracy has almost reached its limit, the semiconductor device is susceptible to misalignment. If a misalignment occurs, a portion 2007a of the first diffusion barrier film 2007 on the copper-containing film 2005 as well as between the carbon-containing films 2005 is etched as shown in FIG. 4B and FIG. 4B. When the first diffusion barrier film 2007 is partially etched, portions of the carbon-containing films 2005a and 2005b are exposed.

When the photoresist layer pattern 2008 removed and the second interlayer insulating film 2012, which is described later, is formed on the copper-containing film 2005 with the portion of the carbon-containing film 2005a exposed, a leakage current flows from the exposed portion of the carbon-containing film 2005a to the second interlayer insulating film 2012 thereabove. Therefore, adjacent carbon-containing films 2005 may be short-circuited. For example, the carbon-containing film 2005a and the carbon-containing film 2005b may be short-circuited. Moreover, the metal (i.e., copper) component of the carbon-containing films 2005 may be diffused into the second interlayer insulating film 2012 formed thereon. As a result, the characteristics of the semiconductor device may deteriorate.

Figure 5A:
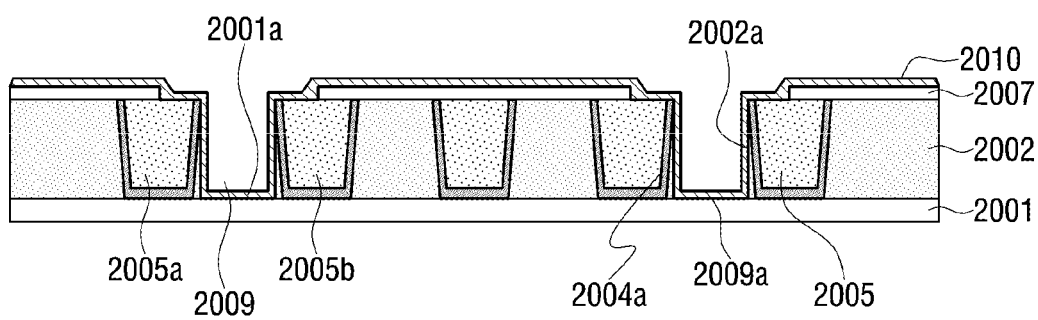
FIG. 5A is a view illustrating a wafer processing state according to the first embodiment.
Figure 5B:
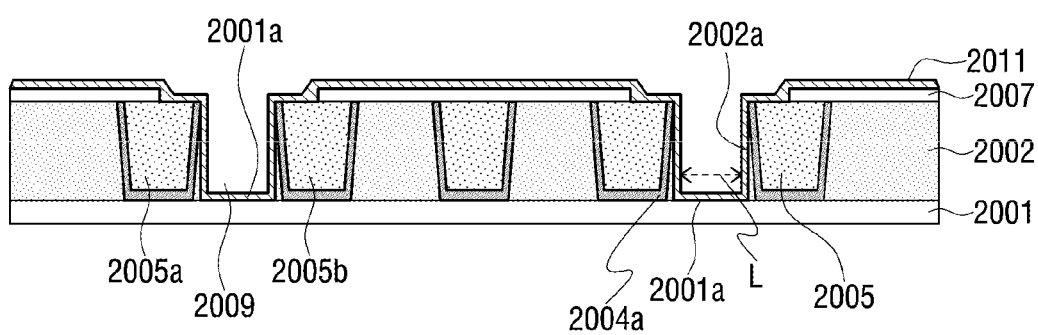
FIG. 5B is a view illustrating a wafer processing state with an exposed portion of the copper-containing film according to the first embodiment.

Therefore, in the first embodiment, after the photoresist layer pattern 2008 is removed, a second diffusion barrier film 2011 obtained by modifying a silicon-containing film 2010 is formed at least on the exposed portion of the copper-containing film 2005 as shown in FIG. 5B. A method of forming the second diffusion barrier film 2011 will be described later.

According to the first embodiment, the first diffusion barrier film 2007 and the second diffusion barrier film 2011 are formed. The characteristics of the first diffusion barrier film 2007 and the second diffusion barrier film 2011 may be summarized as follows. The first diffusion barrier film 2007 is formed on a portion of an upper surface of the copper-containing film 2005. The first diffusion barrier film 2007 suppresses the diffusion of the component of the copper-containing film 2005 from the copper-containing film 2005 into the second wiring layer formed above the first wiring layer through the portion of the upper surface of the copper-containing film 2005. The second diffusion barrier film 2011 suppresses the diffusion of the component of the copper-containing film 2005 from the copper-containing film 2005 into the second wiring layer through a portion of the surface of the copper-containing film 2005 where the first diffusion barrier film 2007 is not formed.

<Second Interlayer Insulating Film Forming Step S105>

Next, a second interlayer insulating film forming step S105 for forming a second interlayer insulating film 2012 on the second diffusion barrier film 2011 is described. Before performing the second interlayer insulating film forming step S105, the second diffusion barrier film 2011 is formed at least on an exposed portion of the copper-containing film 2005, a side surface 2002a of the inter-wire insulating film 2002 and a surface of the insulating film 2001.

Figure 6:
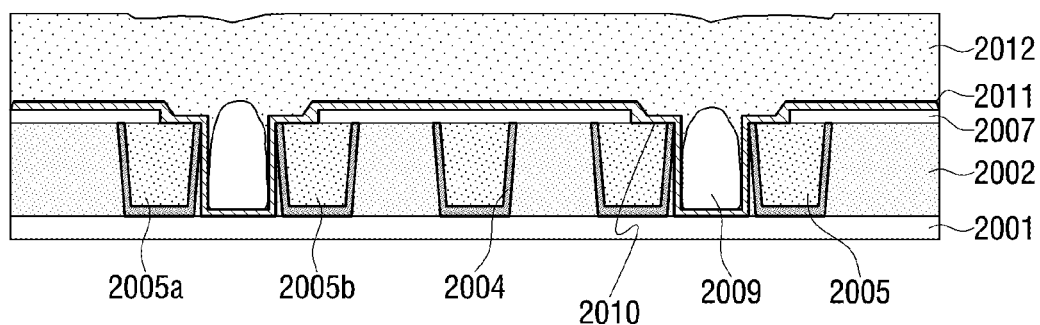
FIG. 6 is a view illustrating a wafer processing state according to the first embodiment.

As shown in FIG. 6, after the second diffusion barrier film 2011 is formed, the second interlayer insulating film 2012 is formed on the second diffusion barrier film 2011. The second interlayer insulating film 2012 includes, for example, a carbon-containing silicon oxide film (SiOC film). The second interlayer insulating film 2012 may be formed by supplying a silicon-containing gas and an oxygen-containing gas onto the wafer 200 to generate a gas phase reaction and then doping carbon.

Next, the second interlayer insulating film forming step S105 wherein the second interlayer insulating film 2012 is formed while securing the recess 2009 will be described. In the second interlayer insulating film forming step S105, deposits for forming the second interlayer insulating film 2012 are accumulated. When the width between the wirings is significantly narrow as described above, the deposits are also accumulated around the upper portion of the first diffusion barrier film 2007. Deposits accumulated around the upper portion of the first diffusion barrier film 2007 block the gas from flowing flow down into the recess 2009. Therefore, the deposition rate at the bottom of the recess 2009 is slower than the deposition rate at the top of the first diffusion barrier film 2007. When the film-forming process is continued in this way, the second interlayer insulating film 2012 is formed while securing the recess 2009. The secured recess 2009 is used as an air gap.

<Polishing Step S106>

Figure 7:
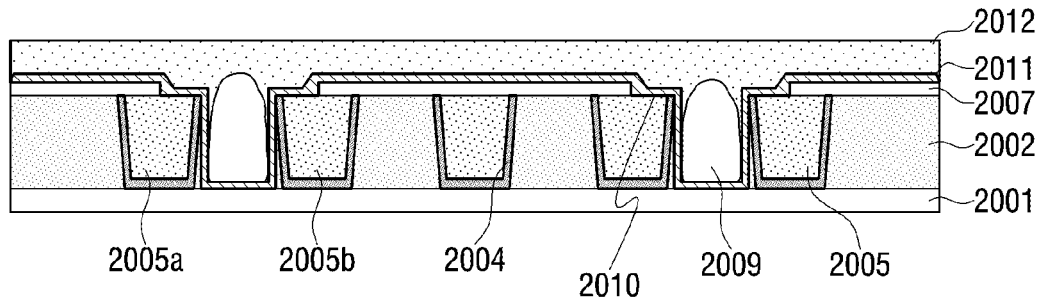
FIG. 7 is a view illustrating a wafer processing state according to the first embodiment.

Before a new wiring layer is formed on the second interlayer insulating film 2012 formed through the second interlayer insulating film forming step S105, the second interlayer insulating film 2012 is polished by a polishing apparatus to remove the unevenness of the second interlayer insulating film 2012 and improve the thickness uniformity of the new wiring layer at the surface of the wafer 200. That is, the surface of the second interlayer insulating film 2012 on which a new wiring layer is to be formed is flattened as shown in FIG. 7. The new wiring layer is then formed on the flattened second interlayer insulating film 2012.

Next, a substrate processing apparatus used in the second diffusion barrier film forming step S104 and a method for forming the second diffusion barrier film 2011 will be described. The method of forming the second diffusion barrier film 2011 is a part of the semiconductor manufacturing process and also a part of substrate processing.

<Substrate Processing Apparatus>

First, the substrate processing apparatus 100 will be described with reference to FIG. 8. In the first embodiment, the second diffusion barrier film 2011 is formed using the substrate processing apparatus 100.

The substrate processing apparatus 100 includes a chamber 202 defined by a flat sealed container having a circular horizontal cross-section. The chamber 202 is made of a metal material such as aluminum (Al) and stainless steel (SUS). The chamber 202 includes a processing space 201 in which the wafer 200 such as a silicon a substrate is processed and a transfer space 203 through which the wafer 200 passes when the wafer 200 is transferred to the processing space 201. The chamber 202 includes an upper vessel 202a and a lower vessel 202b. A partition plate 204 is installed between the upper vessel 202a and the lower vessel 202b.

A substrate loading/unloading port 206 is provided adjacent to a gate valve 205 on the side surface of the lower vessel 202b. The wafer 200 is conveyed between the transfer chamber (not shown) and the transfer space 203 via the substrate loading/unloading port 206. Lift pins 207 are provided at the bottom of the lower vessel 202b.

A substrate support 210 supporting the wafer 200 is installed in the processing space 201. The substrate support 210 includes a support 212 having a substrate placing surface 211 on which the wafer 200 is placed and a heater 213 which is a heating source embedded in support 212. Through-holes 214 are provided at positions of the substrate support 212 corresponding to the lift pins 207 such that the lift pins 207 may pass through. A heater control unit 220 is connected to the heater 213 and controls the energization state of the heater 213.

The substrate support 212 is supported by a shaft 217. The shaft 217 passes through a hole 215 provided at the bottom of the chamber 202 and is connected to an elevating mechanism 218 outside the chamber 202 via a support plate 216. The wafer 200 placed on the substrate placing surface 211 can be lifted and lowered by elevating the shaft 217 and the substrate support 212 by operating the elevating mechanism 218. A bellows 219 covers the periphery of the lower end of the shaft 217. The interior of the chamber 202 is maintained airtight.

When transporting the wafer 200, the substrate support 212 is lowered until the substrate placing surface 211 reaches a "wafer transfer position" facing with the substrate loading/unloading port 206. As shown in FIG. 8, when processing the wafer 200, the substrate support 212 is elevated until the wafer 200 reaches a processing position ("wafer processing position") in the processing space 201.

Specifically, when the substrate support 212 is lowered to the wafer transfer position, the upper ends of the lift pins 207 protrude from the upper surface of the substrate placing surface 211, and the lift pins 207 support the wafer 200 from therebelow. When the substrate support 212 is elevated to the wafer processing position, the lift pins 207 are buried from the upper surface of the substrate placing surface 211 and the substrate placing surface 211 supports the wafer 200 from thereunder. Since the lift pins 207 are in direct contact with the wafer 200, the lift pins 207 are made of a material such as quartz and alumina.

A shower head 230, which is a gas dispersion mechanism, is installed at the upstream side of the processing space 201. A gas introduction hole 231a through which a first dispersion mechanism 241 is inserted is provided in a cover 231 of the shower head 230. A first dispersion mechanism 241 includes a front end portion 241a inserted into the shower head 230 and a flange 241b fixed to the cover 231.

The front end portion 241a has a columnar shape, for example, a cylindrical shape. Discharge holes (not shown) are provided on the side surface of the cylindrical front end portion 241a. The gas supplied through the gas supply unit (gas supply system) of the chamber described later is supplied into a buffer space 232 via the front end portion 241a.

The shower head 230 includes a dispersion plate 234, which is a second dispersion mechanism for dispersing the gas. The upstream side of the dispersion plate 234 is the buffer space 232 and the downstream side of the dispersion plate 234 is the processing space 201. A plurality of through-holes 234a are provided in the dispersion plate 234. The dispersion plate 234 is disposed to face the substrate placing surface 211.

The dispersion plate 234 is, for example, disk-shaped. The plurality of through-holes 234a are distributed throughout the dispersion plate 234. For example, the distances between adjacent through-holes 234a are the same. The through-hole 234a at the outermost periphery of the dispersion plate 234 is disposed outer than the edge of the wafer placed on the substrate support 212.

The upper vessel 202a includes a flange (not shown) and a support block 233 is placed on and fixed to the flange (not shown). The support block 233 includes a flange 233a and the dispersion plate 234 is placed on and fixed to the flange 233a. The cover 231 is fixed to the upper surface of the support block 233. In this structure, the cover 231, the dispersion plate 234 and the support block 233 may be separated in the order.

<Supply System>

The first dispersion mechanism 241 is connected to the gas introduction hole 231a provided in the cover 231 of the shower head 230. A common gas supply pipe 242 is connected to the first dispersion mechanism 241. The flange (not shown) is provided in the first dispersion mechanism 241. The flange provided in the first dispersion mechanism 241 is secured to the flange of the cover 231 or the common gas supply pipe 242 by a screw-like fastener.

The first dispersion mechanism 241 and the common gas supply pipe 242 communicate with each other within the tubes. The gas supplied through the common gas supply pipe 242 is supplied into the shower head 230 through the first dispersion mechanism 241 and the gas introduction hole 231a.

A first gas supply pipe 243a, a second gas supply pipe 244a, a third gas supply pipe 245a and a fourth gas supply pipe 249a are connected to the common gas supply pipe 242.

A first gas is supplied mainly by the first gas supply system 243 including the first gas supply pipe 243a and a second gas is supplied mainly by a second gas supply system 244 including the second gas supply pipe 244a. A third gas is mainly supplied by a third gas supply system 245 including the third gas supply pipe 245a and a fourth gas is supplied mainly by a fourth gas supply system 249 including the fourth gas supply pipe 249a.

<First Gas Supply System>

A first gas supply source 243b, a mass flow controller 243c (MFC) which is a flow rate controller and an on/off valve 243d are installed at the first gas supply pipe 243a in order from the upstream side to the downstream side of the first gas supply pipe 243a.

The first gas is supplied to the shower head 230 via the mass flow controller 243c and the valve 243d provided in the first gas supply pipe 243a and the common gas supply pipe 242.

The first gas includes, for example, hydrogen ($H_2$) gas. The first gas is one of the reducing gases, or process gases. In the first embodiment, the first gas is, for example, hydrogen (H) capable of reduction and is also referred to as a "hydrogen-containing gas"

The downstream end of the first inert gas supply pipe 246a is connected to the first gas supply pipe 243a at the downstream side of the valve 243d. An inert gas supply source 246b, a mass flow controller 246c which is a flow rate controller and the on/off valve 246d are installed at the first inert gas supply pipe 246a in order from the upstream side to the downstream side of the first inert gas supply pipe 246a. An inert gas acts as a carrier gas or a dilution gas in a reduction step S304.

In the first embodiment, the inert gas includes, for example, nitrogen ($N_2$) gas. Instead of $N_2$ gas, rare gases such as helium (He) gas, neon (Ne) gas and argon (Ar) gas may be used as the inert gas.

The first gas supply system 243 includes the first gas supply pipe 243a, the mass flow controller 243c and the valve 243d A first inert gas supply system includes a first inert gas supply pipe 246a, the mass flow controller 246c and the valve 246d. The first inert gas supply system may further include an inert gas supply source 234b and the first gas supply pipe 243a.

The first gas supply system 243 may further include the first gas supply source 243b and the first inert gas supply system.

<Second Gas Supply System>

A second gas supply source 244b, a mass flow controller 244c, which is a flow rate controller and an on/off valve 244d are installed at the second gas supply pipe 244a in order from the upstream side to the downstream side of the second gas supply pipe 244a.

The second gas is supplied into the shower head 230 via the mass flow controller 244c and the valve 244d installed on the second gas supply pipe 244a and the common gas supply pipe 242.

The second gas is one of the process gases. The second gas includes, for example, a silicon-based gas. The second gas includes, for example, dichlorosilane ($SiH_2Cl_2$, abbreviated as DCS) gas containing halogen (e.g. Chlorine).

The second gas supply system 244 includes the second gas supply pipe 244a, the mass flow controller 244c and the valve 244d The downstream end of a second inert gas supply pipe 247a is connected to the second gas supply pipe 244a at the downstream side of the valve 244d. An inert gas supply source 247b, a mass flow controller 247c, which is a flow rate controller and an on/off valve 247d are installed at the second inert gas supply pipe 247a in order from the upstream side to the downstream side of the second inert gas supply pipe 247a.

The inert gas is supplied into the shower head 230 through the mass flow controller 247c and the valve 247d provided in the second inert gas supply pipe 247a and the second gas supply pipe 244a. The inert gas acts as a carrier gas or a dilution gas in the film-forming step S306.

A second inert gas supply system includes the second inert gas supply pipe 247a, the mass flow controller 247c and the valve 247d. The second inert gas supply system may further include the inert gas supply source 247 and the second gas supply pipe 243a.

The second gas supply system 244 may further include the second gas supply source 244b and the second inert gas supply system.

<Third Gas Supply System>

A third gas supply source 245b, a mass flow controller 245c, which is a flow rate controller and an on/off valve 245d are installed at the third gas supply pipe 245a in order from the upstream side to the downstream side of the third gas supply pipe 245a.

The third gas is supplied to the shower head 230 through the mass flow controller 245c and the valve 245d provided at the third gas supply pipe 245a and the common gas supply pipe 242.

The third gas is one of the process gases. The third gas includes, for example, a silicon-based gas. The third gas includes, for example, disilane ($Si_2H_6$, abbreviated as DS).

The downstream end of an inert gas supply pipe 248a is connected to the third gas supply pipe 245a at the downstream side of the valve 245d. An inert gas supply source 248b, a mass flow controller 248c, which is a flow rate controller and an on/off valve 248d are installed at the inert gas supply pipe 248a in order from the upstream side to the downstream side of the inert gas supply pipe 248a.

The third gas supply system 245 includes the third gas supply pipe 245a, the mass flow controller 245c and the valve 245d.

The inert gas supply system includes the inert gas supply pipe 248a, the mass flow controller 248c and the valve 248d. The inert gas supply system may further include the inert gas supply source 248b and the third gas supply pipe 245a.

The third gas supply system 245 may further include the third gas supply source 245b and the inert gas supply system.

<Fourth Gas Supply System>

A fourth gas supply source 249b, a mass flow controller 249c, which is a flow rate controller, an on/off valve 249d and a remote plasma unit 249e are installed at the fourth gas supply pipe 249a in order from the upstream side to the downstream side of the fourth gas supply pipe 249a.

The nitrogen-containing gas used in a modifying step S308 is supplied to the shower head 230 via the mass flow controller 249c and the valve 249d provided at the fourth gas supply pipe 249a, the remote plasma unit 249e and the common gas supply pipe 242.

In the first embodiment, the nitrogen-containing gas includes, for example, ammonia ($NH_3$) gas. Instead of $NH_3$ gas, a gas such as nitrogen ($N_2$) gas may be used as the nitrogen-containing gas.

The downstream end of an inert gas supply pipe 250a is connected to the fourth gas supply pipe 249a at the downstream side of the valve 249d. An inert gas supply source 250b, a mass flow controller 250c, which is a flow rate controller and an on/off valve 250d are installed at the inert gas supply pipe 250a in order from the upstream side to the downstream side of the inert gas supply pipe 250a.

The fourth gas supply system 249 includes the fourth gas supply pipe 249a, the mass flow controller 249c, a valve 249d and the remote plasma unit 249e.

An inert gas supply system includes the inert gas supply pipe 250a, the mass flow controller 250c and the valve 250d. The inert gas supply system may further include the inert gas supply source 250b and the fourth gas supply pipe 249a.

The fourth gas supply system 249 may further include the fourth gas supply source 249b and the inert gas supply system.

<Exhaust System>

An exhaust system for exhausting the atmosphere of the chamber 202 includes a plurality of exhaust pipes connected to the chamber 202. Specifically, the exhaust system includes an exhaust pipe 262 connected to the processing space 201 and an exhaust pipe 261 connected to the transfer space 203. The exhaust pipe 264 is connected to the exhaust pipes 261 and 262 at the downstream sides of the exhaust pipes 261 and 262.

The exhaust pipe 261 is connected to a side surface or a bottom surface of the transfer space 203. A turbo molecular pump 265 is installed at the exhaust pipe 261. A valve 266, which a first exhaust valve for the transfer space 203, is installed at the exhaust pipe 261 at the upstream side of the turbo molecular pump 265.

The exhaust pipe 262 is connected to a side surface of the processing space 201. An APC (Automatic Pressure Controller) 276, which is a pressure controller for adjusting the inner pressure of the processing space 201 to a positive pressure, is installed at the exhaust pipe 262. The APC 276 includes a valve body (not shown) that is capable of adjusting opening degree thereof. The APC 276 adjusts the conductance of the exhaust pipe 262 in accordance with an instruction from the controller 280, which will be described later. A valve 275 is installed at exhaust pipe 262 at the upstream side of the APC 276. A valve 277 is installed at the exhaust pipe 262 at the downstream side of the APC 276. The exhaust pipe 262, the valve 275, the valve 277 and the APC 276 are collectively referred to as a process chamber exhaust unit.

A dry pump 267 is installed at the exhaust pipe 264. As shown in FIG. 8, the exhaust pipe 262 and the exhaust pipe 261 are connected to the exhaust pipe 264 in order from the upstream side to the downstream side of the exhaust pipe 264. The DP 267 is installed at the exhaust pipe 264 at the downstream side of the portions to which the exhaust pipe 262 and the exhaust pipe 261 are connected. The DP 267 exhausts the atmosphere of the processing space 201 and the transfer space 203 via the exhaust pipe 262 and the exhaust pipe 261, respectively. The DP 267 may operate as an auxiliary pump assisting the operation of the TMP 265. That is, it is difficult for the TMP 265, which is a high vacuum (or ultra-high vacuum) pump, to exclusively perform the exhaust to the atmospheric pressure. The DP 267 is used as an auxiliary pump for performing exhaust to atmospheric pressure. For example, an air valve may be used as each valve of the exhaust system described above.

<Controller>

Figure 9:
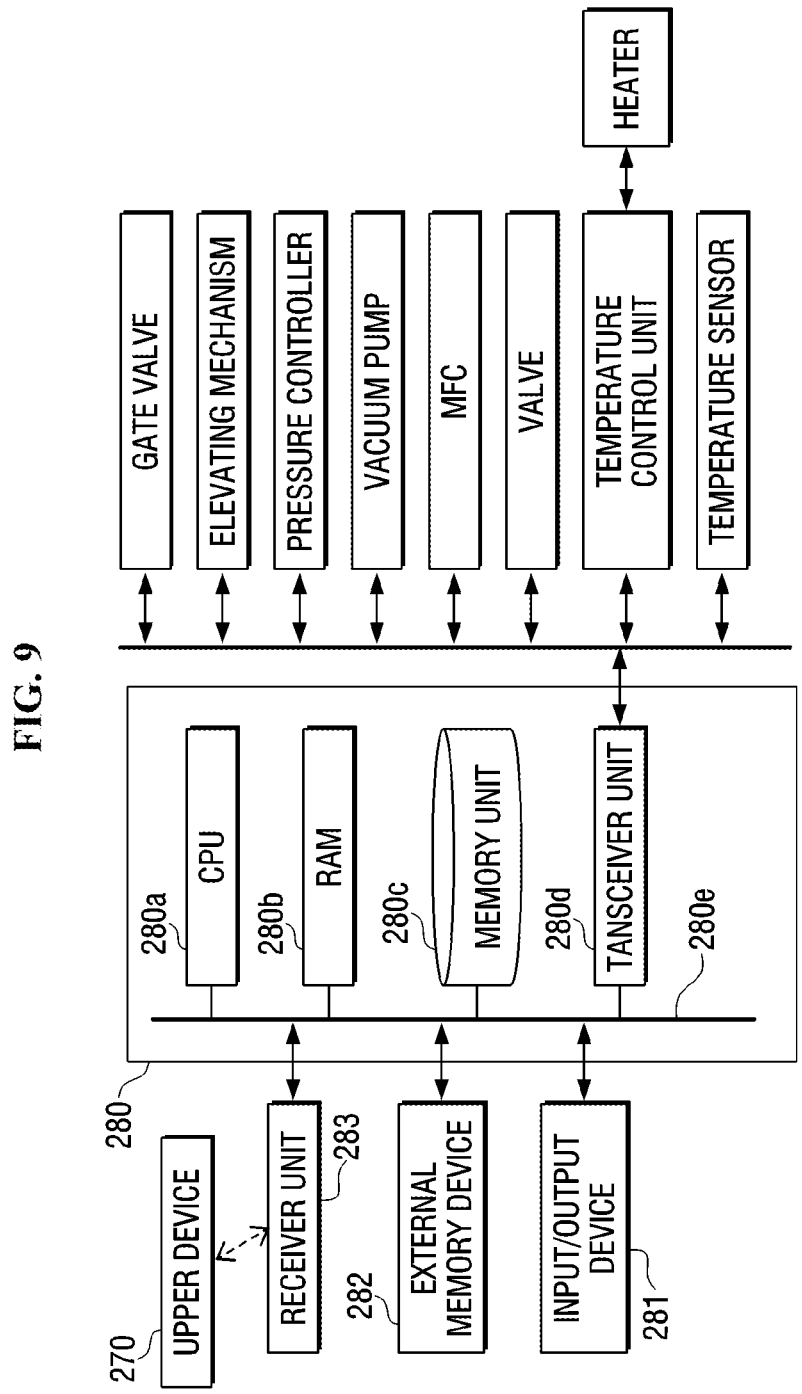
FIG. 9 exemplifies a configuration of a controller of a substrate processing apparatus used in the first embodiment.

The substrate processing apparatus 100 includes a controller 280 for controlling the operation of the configurations of the substrate processing apparatus 100. As shown in FIG. 9, the controller 280 includes at least an arithmetic unit (CPU) 280a, a temporary memory unit (RAM) 280b, a memory unit 280c and a transceiver unit 280d. The controller 280 is connected to the components of the substrate processing apparatus 100 via the transceiver unit 280d, calls a program or recipe from the memory unit 280c in accordance with an instruction of the host controller or a user's instruction, and controls the operation of the components of the substrate processing apparatus 100 according to the contents of the instructions. The controller 280 may be embodied by a dedicated computer or as a general-purpose computer. In the first embodiment, controller 280 may be embodied by preparing an external memory device 282 (e.g. a magnetic disk such as a magnetic tape, a flexible disk and a hard disk, an optical disk such as a CD and a DVD, a magneto-optical disk such as MO and a semiconductor memory such as a USB memory (USB flash drive) and a memory card) storing the program, and installing the program on the general-purpose computer using the external memory device 282. The means for providing the program to the computer is not limited to the external memory device 282. The program can be supplied to the computer using communication means such as the Internet and a dedicated line. That is, the program may be provided to the computer without using the external memory device 282 by receiving the information (i.e., program) from an upper device (host apparatus) 270 via the receiver unit 283. A user can input an instruction to the controller 280 using an input/output device 281 such as a keyboard and a touch panel.

The memory unit 280c and the external memory device 282 may be embodied by a computer-readable recording medium. Hereinafter, the memory unit 280c and the external memory device 282 are collectively referred to simply as a recording medium. Hereinafter, the term "recording medium" refers to only the memory unit 280c, only the external memory device 282, or both.

<Detailed Description of the Second Diffusion Barrier Film Forming Step S104>

Next, the second diffusion barrier film forming step S104 performed on the wafer 200 transferred into the substrate processing apparatus 100 will be described in detail with reference to FIG. 10. The wafer 200 processed in the second diffusion barrier film forming step S104 includes the copper-containing film 2005 having the exposed portion with the photoresist layer pattern 2008 of FIG. 4B removed.

An example of forming the second diffusion barrier film 2011 using $H_2$ gas as the first process gas, DCS gas as the second process gas, DS gas as the third process gas, and $NH_3$ gas as the fourth process gas will be described.

<Substrate Loading and Placing Step S302>

When the substrate support 212 of the substrate processing apparatus 100 is lowered to the position for transferring the wafer 200 (the wafer transfer position), the lift pins 207 penetrates the through-holes 214 of the substrate support 212. As a result, the lift pins 207 protrude a predetermined height above the surface of the substrate support 212. Next, by opening the gate valve 205, the transfer space 203 is in communication with the transfer chamber (not shown). The wafer 200 is transferred from the transfer chamber (not shown) into the transfer space 203 using a wafer transfer device (not shown). The wafer 200 is transferred onto the lift pins 207 using a wafer transfer device (not shown) to be placed horizontally on the lift pins 207 protruding from the surface of the substrate support 212.

After the wafer 200 is transferred into the chamber 202, the wafer transfer device is retracted to the outside of the chamber 202, and the gate valve 205 is closed to seal the chamber 202. Thereafter, when the substrate support 212 is elevated, the wafer 200 is placed on the substrate placing surface 211 of on the substrate support 212. When the substrate support 212 is further elevated, the wafer 200 is elevated to the position for processing the wafer 200 (wafer processing position) in the processing space 201 described above.

After the wafer 200 is loaded into the transfer space 203 and elevated to the wafer processing position in the processing space 201, the valve 266 is closed. The transfer space 203 is thereby isolated from the TMP 265, and the exhaust of the transfer space 203 by the TMP 265 is terminated. By opening the valve 275, the processing space 201 communicates with the APC 276. The APC 276 controls the exhaust flow rate of the processing space 201 by the DP 267 by adjusting the conductance of the exhaust pipe 263. The inner pressure of the processing space 201 is thereby maintained at a predetermined pressure (for example, a high vacuum ranging from $10^{-5}$ Pa to $10^{-1}$ Pa).

When the wafer 200 is placed on the substrate support 212, the heater 213 embedded in the substrate support 212 is turned on. The heater 213 is controlled to adjust the temperature of the surface of the wafer 200 to a predetermined temperature. The temperature of the wafer 200 ranges, for example, from room temperature to 800° C., preferably from room temperature to 700° C. The temperature of the heater 213 is calculated by the controller 280 based on the temperature detected by a temperature sensor (not shown). The temperature control unit 220 adjusts the temperature of the heater 213 by controlling the energization state of the heater 213 based on the control value.

<Reduction Step S304>

Next, a reduction step S304 is performed. In the reduction step S304, the $H_2$ gas is supplied to the processing space 201 by the first gas supply system. During the supply of $H_2$ gas in the reduction step S304, a natural oxide film formed on the surface of the wafer 200 is removed. In particular, the exposed portion of the copper-containing film 2005 is cleaned. The reaction between the exposed portion of the copper-containing film 2005 and the second diffusion barrier film 2011 (silicon-containing film 2010 in case of reduction step S304) may be eliminated by the cleaning. Thus, the reactivity between the exposed portion of the copper-containing film 2005 and the subsequently formed second diffusion barrier film 2011 may be increased throughout the entire exposed portion of the copper-containing film 2005. As a result, the second diffusion barrier film 2011 may be uniformly formed on the exposed portion of the copper-containing film 2005.

In the reduction step S304, the inner pressure of the processing space 201 ranges from 100 Pa to 1000 Pa, the temperature of the wafer 200 ranges from 150° C. to 400° C., and the flow rate of the supplied hydrogen-containing gas ranges from 1000 sccm to 3000 sccm.

After a predetermined time elapses, the supply of the hydrogen-containing gas is stopped and the hydrogen gas in the process chamber 201 is exhausted.

<Film-Forming Step S306>

As shown in FIG. 5A, in the film-forming step S306, the silicon-containing film 2010 is formed on at least the exposed portion of the copper-containing film 2005, the side surface 2002a of the inter-wire insulating film 2002 and the surface 2001a of the insulating film 2001. Thereafter, as shown in FIG. 5B, the second diffusion barrier film 2011 is formed by modifying the silicon-containing film 2010.

As a comparative example, a case where the second diffusion barrier film 2011 is not formed on the side surface 2002a of the inter-wire insulating film 2002 and the surface 2001a of the insulating film 2001 but only on the exposed portion of the copper-containing film 2005 is considered. According to the comparative example, a film stress described below occurs.

In one example, the film stress occurs in the polishing step S106. After the second diffusion barrier film 2011 is formed as described above, the polishing step S106 is performed. In the polishing step S106, the wafer 200 is polished by the polishing apparatus. During polishing, the wafer 200 is provided with a slurry and rotated relative to a flat plate on which a polishing cloth is attached while pressing the surface of the wafer 200 against the flat plate. The film formed on the wafer 200 is affected by the frictional force generated by the relative rotation. Therefore, film stress occurs.

In another example, when the wafer 200 is heated, the films formed on the wafer 200 thermally expand. Due to the difference in the thermal expansion rates of the films, film stress may occur.

When the second diffusion barrier film 2011 is formed only on the copper-containing film 2005 as in the above-described comparative example, the structure for relaxing the film stress between the recess 2009 and the side surface 2002a of the inter-wire insulating film 2002 is not present. Therefore, the side surface 2002a of the inter-wire insulating film is particularly susceptible to film stress. For example, it is difficult to maintain stable quality since the inter-wire insulating film 2002 or barrier film 2004 adjacent to the recess 2009 may collapse or be displaced by the film stress.

Thus, in the first embodiment, the second diffusion barrier film 2011 is formed on at least the exposed portion of the copper-containing film 2005, the side surface 2002a of the inter-wire insulating film 2002 and the surface 2001a of the insulating film 2001. The second diffusion barrier film 2011 suppresses the diffusion of the components of the copper-containing film 2005 and increases the physical strength of the structure constituting the recess 2009.

Figure 11:
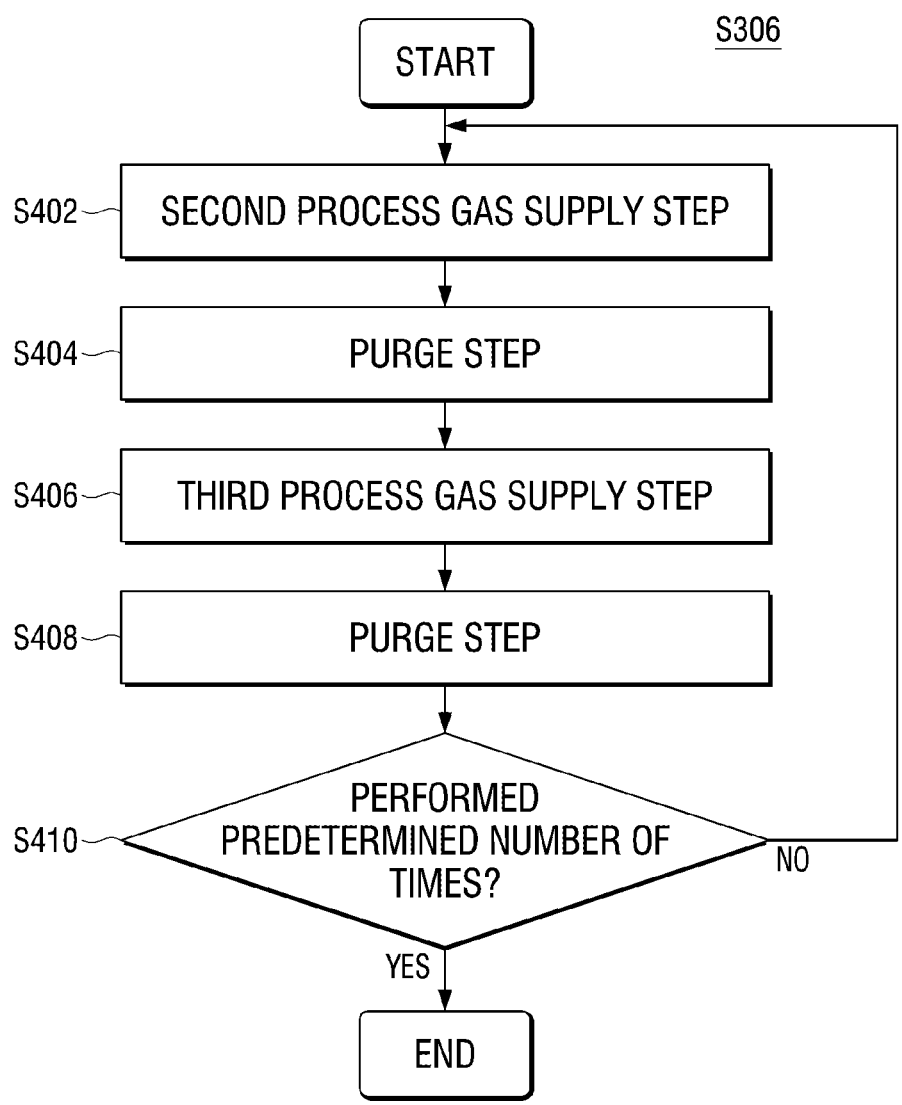
FIG. 11 illustrates a film-forming process according to the first embodiment.

The method of forming the second diffusion barrier film 2011 in accordance with the first embodiment will be described below. The film-forming step S306 will be described with reference to the flowchart shown in FIG. 11. FIG. 11 is a flow chart illustrating the detailed configuration of the film-forming step S306.

<Second Process Gas Supply Step S402>

When the reduction step S304 is completed, the inner pressure of the process chamber 201 is adjusted. When the inner pressure of the process chamber 201 reaches a predetermined pressure and the temperature of the wafer 200 reaches a predetermined temperature, DCS gas, which is a process gas, for example, is flown into the process chamber 201 through the common gas supply pipe 242.

At this time, the DCS gas is decomposed into a silicon component and chlorine component by heat. The silicon component and the chlorine component are supplied to the side surface 2002a of the inter-wire insulating film 2002 on the wafer 200 and to the surface 2001a of the insulating film 2001 at the bottom of the recess 2009. The chlorine component breaks the bonds between silicon and oxygen or between silicon and carbon on the side surface 2002a of the inter-wire insulating film 2002 and on the surface 2001a of the insulating film 2001. The components generated by the breaking the bonds attach to the silicon component. Silicon and copper also bond with each other by the reaction occurring at the exposed portion of copper-containing film 2005. As a result, a silicon-containing film is formed. That is, the silicon-containing film is formed at least on the exposed portion of the copper-containing film 2005, the side surface 2002a of the inter-wire insulating film 2002 and the surface 2001a of the insulating film 2001. After a predetermined time elapses, the supply of DCS gas is stopped.

In the second process gas supply step S402, the flow rate of the supplied DCS gas ranges, for example, from 10 sccm to 1000 sccm, preferably from 10 sccm to 500 sccm. The time duration of supplying the DCS gas to the wafer 200 ranges, for example, from 1 second to 600 seconds, preferably from 1 second to 30 seconds. The temperature of the wafer 200 ranges, for example, from 200° C. to 500° C., preferably from 300° C. to 400° C.

<Purge Step S404>

After the DCS gas supply is stopped, $N_2$ gas is supplied through the inert gas supply pipe 250a and the fourth gas supply pipe 249a. By supplying $N_2$ gas, the processing space 201 is purged. At this time, with the valves 275 and 277 open, the APC 276 adjusts the pressure of the processing space 201 to a predetermined pressure. The valves of the exhaust system other than the valves 275 and 277 are closed. The DCS gas that is not coupled to the wafer 200 in the second process gas supply step S402 is removed from the processing space 201 by the DP 278 via the exhaust pipe 262.

When the supply of $N_2$ gas through the inert gas supply pipe 250a is completed, the pressure control by the APC 276 is resumed with the valve 277 and valve 275 open. The valves of the exhaust system other than the valves 277 and 275 are closed. $N_2$ gas is continuously supplied through the fourth gas supply pipe 249a to continuously purge the shower head 230 and the processing space 201.

<Third Process Gas Supply Step S406>

In the second process gas supply step S402, the DCS gas containing chlorine component is supplied to form the silicon-containing film wherein the components generated by the breaking the bonds attach to the silicon component. While the chlorine component breaks the bond in the insulating films, the chlorine component may also be attached the components generated by the breaking the bonds. In order to remove the chlorine component from the silicon-containing film, DS gas, which is a gas containing a hydrogen component and a silicon component, is supplied in the third process gas supply step S406.

After the shower head buffer chamber 232 and the processing space 201 are purged, the third process gas supply step S406 is performed. In the third process gas supply step S406, the DS gas, which is the third process gas, is supplied into the processing space 201 via the shower head 230 by opening the valve 244d.

The DS gas is supplied into the processing space 201 via the shower head 230. The supplied DS gas is thermally decomposed and reacts with the silicon-containing film on the wafer 200. Specifically, the hydrogen component of the DS gas attaches to the chlorine component at the surface of the insulating film to form HCl, and the silicon component of the DS gas is attached to the dangling bond. As a result, the chlorine component is removed from the silicon-containing film. That is, the silicon-containing film is modified into a dense silicon-containing film with little impurities. When a predetermined time elapses, the supply of DS gas is stopped.

In the third process gas supply step S406, the flow rate of the supplied DS gas ranges, for example, from 10 sccm to 1000 sccm, preferably from 10 sccm to 500 sccm. The time duration of supplying the DCS gas to the wafer 200 ranges, for example, from 1 second to 600 seconds, preferably from 1 second to 60 seconds. The temperature of the wafer 200 ranges, for example, from 200° C. to 500° C., preferably from 300° C. to 400° C.

<Purge Step S408>

After the DS gas supply is stopped, $N_2$ gas is supplied through the inert gas supply pipe 250a and the fourth gas supply pipe 249a. By supplying $N_2$ gas, the processing space 201 is purged. At this time, with valve 275 and valve 277 open, APC 276 adjusts the pressure of processing space 201 to a predetermined pressure. The valves of the exhaust system other than the valves 275 and 277 are closed. As a result, the HCl gas generated in the third process gas supply step S406 is removed from the processing space 201 by the DP 278 via the exhaust pipe 262.

When the supply of $N_2$ gas through the inert gas supply pipe 250a is completed, the pressure control by the APC 276 is resumed with the valve 277 and valve 275 open. The valves of the exhaust system other than the valves 277 and 275 are closed. $N_2$ gas is continuously supplied through the fourth gas supply pipe 249a to continuously purge the shower head 230 and the processing space 201.

<Determination Step S410>

The controller 280 determines whether a cycle including the second process gas supply step S402, the purge step S404, the third process gas supply step S406 and the purge step S408 is performed a predetermined number of times (n times). When the cycle is performed the predetermined number of times, it is determined that the silicon-containing film having a desired thickness is formed on the wafer 200. The thickness of the silicon-containing film is, for example, 5 nm.

When the cycle is determined to performed the predetermined number of times in the determination step S410, the film-forming step S306 completed.

The silicon-containing film 2010 is formed on at least the exposed portion of the copper-containing film 2005, the side surface 2002a of the inter-wire insulating film 2002 and the surface 2001a of the insulating film 2001. By laminating the dense silicon-containing film, the silicon-containing film 2010 having high physical strength may be formed.

<Modifying Step S308>

Next, referring back to FIG. 10, the modifying step S308 will be described. Generally, the silicon component easily diffuses into the carbon-containing film, for example, at a high temperature of 400° C. In the first embodiment, the silicon component in the silicon-containing film 2010 formed on the exposed portion of the copper-containing film 2005 may diffuse into the copper-containing film 2005.

When the silicon component diffuses, the electrical resistance of the copper-containing film 2005 increases. As a result, the wiring is degraded when the copper-containing film 2005 is used as the wiring. Thus, it is more preferable that the silicon-containing film 2010 is modified by the modifying step S308 to prevent the diffusion of the silicon component.

A method of modifying the silicon-containing film 2010 of the modifying step S308 will be described. The first gas supply system 243, the second gas supply system 244, and the third gas supply system 245 are closed to stop the gas supply by each gas supply system. This completes the film-forming step S306. Next, $NH_3$ gas is supplied by opening the valve 249d. At this time, the remote plasma unit 249e is turned on in advance.

The $NH_3$ gas in the plasma state is supplied onto the wafer 200. The $NH_3$ gas in the plasma states reacts with the silicon-containing film 2010 to nitride the silicon-containing film, thereby forming the second diffusion barrier film 2011. Since the bonding force between the silicon component and the nitrogen component formed by the nitriding process is stronger than the bonding force between silicon and copper or the bonding force between the silicon elements, the diffusion of the silicon component is suppressed. After a predetermined time elapses, the supply of $NH_3$ gas is stopped.

In order to reduce the dielectric constant, the recess 2009 must be wide. That is, the recess 2009 should be as wide as possible to lower the dielectric constant. As shown in FIG. 5B, the width (L) of the recess 2009 can be secured by modifying the silicon-containing film 2010 according to the first embodiment. Therefore, the dielectric constant may be lowered while increasing the physical strength of the recess 2009.

The silicon-containing film 2010 formed on the side surface 2002a of the inter-wire insulating film 2002 and the surface 2001a of the insulating film 2001 may also referred to as a reinforcement film.

The reason for using plasma of nitrogen-containing gas in nitriding of silicon-containing films 2010 will be described. As described above, at high temperatures, the silicon component easily diffuses into the copper-containing film 2005. In order to nitride the silicon-containing film 2010, high energy is required. When the reaction energy is supplemented by heat, the wafer 200 must be heated to a high temperature. As the temperature of the wafer 200 rises, the silicon component diffuses and the resistance of the copper-containing film 2005 increases. Since the copper-containing film 2005 is used as the wiring, it is preferable that the resistance of the copper-containing film 2005 should be as low as possible for efficient current flow.

Thus, the nitriding process is performed at a temperature such as 380° C. to suppress the diffusion of the silicon component into the copper-containing film 2005. A method of performing the nitriding process at such temperature includes, for example, a method of supplying a nitrogen-containing gas in a plasma state. That is, by supplementing the energy required for the reaction with plasma, the silicon-containing film can be nitrided even at low temperatures.

The flow rate of the $NH_3$ gas supplied in the modifying step S308 ranges, for example, from 10 sccm to 1000 sccm, preferably from 10 sccm to 500 sccm. The time duration of supplying $NH_3$ gas to the wafer 200 ranges, for example, from 1 second to 600 seconds, preferably from 1 second to 120 seconds. The temperature of the wafer 200 ranges, for example, from 200° C. to 400° C., preferably from 300° C. to 380° C.

<Substrate Unloading Step S310>

When the modifying step S308 is completed, the substrate unloading step S310 is performed. In the substrate unloading step S310, the substrate support 212 is lowered and the wafer 200 is supported by the lift pins 207 protruding from the surface of the substrate support 212. The wafer 200 is thereby transferred from the wafer processing position to the wafer transfer position.

Next, when the wafer 200 is moved to the transfer position, the transfer space 203 is isolated from the exhaust pipe 264 by closing the valve 275. By opening the valve 266 and exhausting the atmosphere of the transfer space 203 using the TMP 265 (and the DP 267), the inner pressure of the chamber 202 is maintained at a high vacuum (e.g., $10^{-5}$ Pa or less). Similarly, the difference between the inner pressure of the transfer chamber maintained at a high vacuum (ultra-high vacuum) state (e.g., $10^{-6}$ Pa or less) and the inner pressure of the chamber 202 is reduced. When a predetermined pressure is reached, the wafer 200 is unloaded by an arm (not shown).

<Effects>

The main effects of the first embodiment are as follows.

(a) By forming the second diffusion barrier film 2011, the diffusion of the metal component into the upper layer may be suppressed even when the copper-containing film 2005 is exposed in the etching step.

(b) By forming the second diffusion barrier film 2011, the short-circuiting between the adjacent carbon-containing films 2005 may be prevented even when the copper-containing film 2005 is exposed in the etching step.

(c) The physical strength of the structure constituting the recess 2009 can be increased by forming the second diffusion barrier film 2011 on at least the exposed portion of the copper-containing film 2005, the side surface 2002a of the inter-wire insulating film 2002 and the surface 2001a of the insulating film 2001.

Second Embodiment

The second embodiment is described hereinafter. In particular, the second embodiment differs from the first embodiment in the configuration of the gas supply system of the substrate processing apparatus and the film-forming step S306.

The second embodiment will be described with reference to FIG. 12 and FIG. 13, focusing on differences from the first embodiment. The description of the second embodiment which is the same as that of the first embodiment is omitted.

Figure 8:
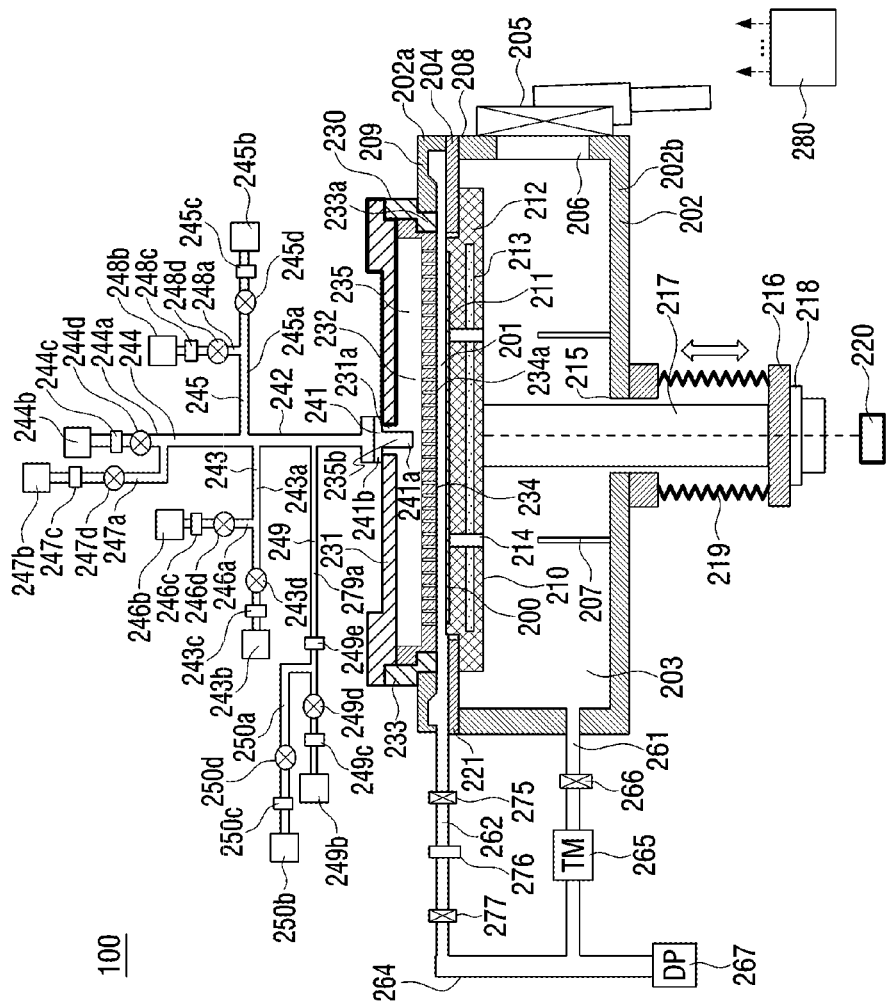
FIG. 8 exemplifies a configuration of a substrate processing apparatus used in the first embodiment.
Figure 12:
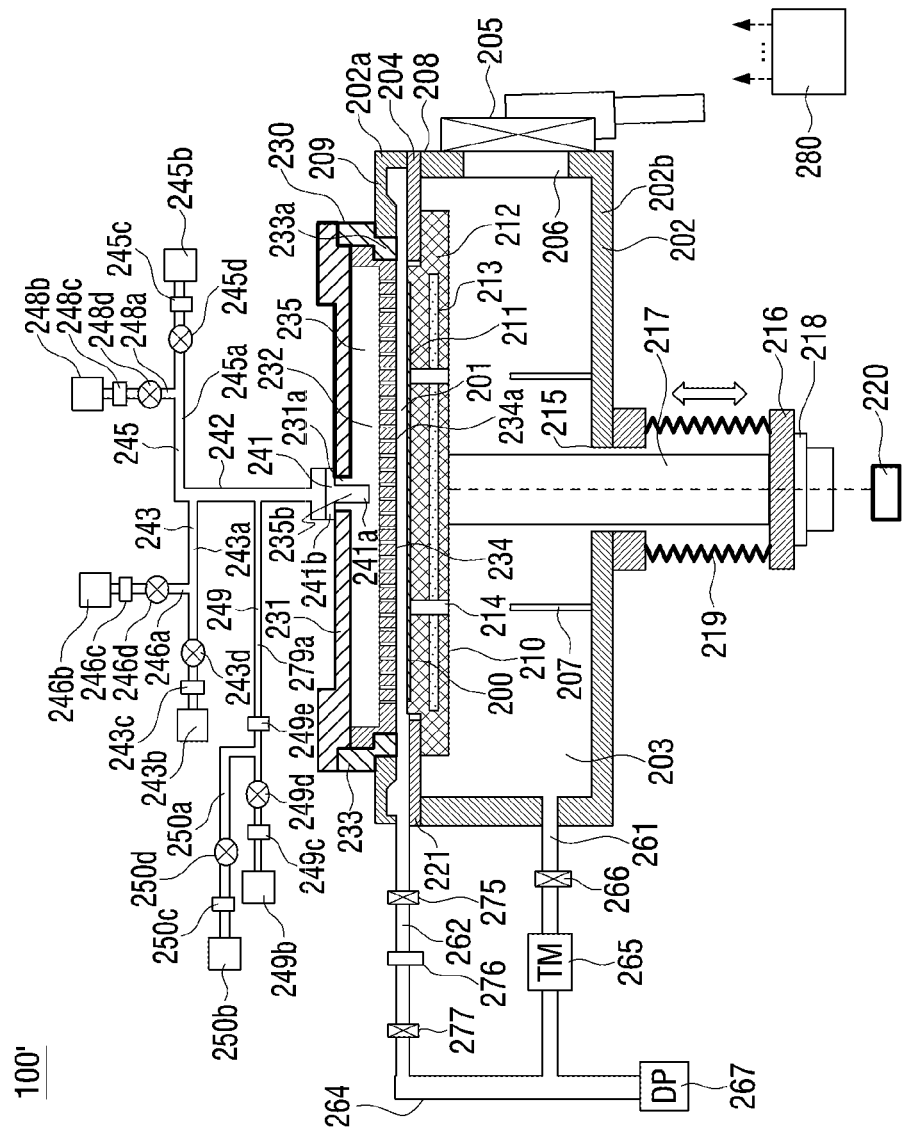
FIG. 12 exemplifies a configuration of a substrate processing apparatus used in a second embodiment.
Figure 13:
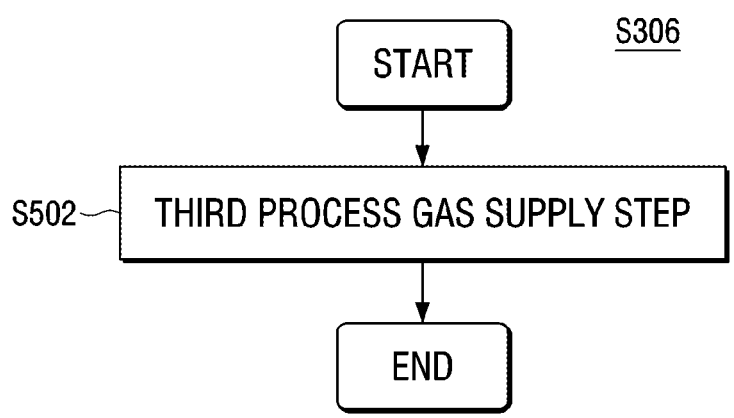
FIG. 13 shows a film-forming process according to the second embodiment.

FIG. 12 illustrates the configuration of the substrate processing apparatus 100' used in the second embodiment similar to FIG. 8. FIG. 13 illustrates the film-forming step S306 of FIG. 10 according to the second embodiment.

<Substrate Processing Apparatus>

The substrate processing apparatus 100' used in the second embodiment will be described with reference to FIG. 12, focusing on the difference between the first embodiment and the second embodiment. The substrate processing apparatus 100' shown in FIG. 8 differs from the apparatus shown in FIG. 12 in that the substrate processing apparatus 100' does not include the second gas supply system 244.

<Supply System>

The first gas supply pipe 243a, the third gas supply pipe 245a and the fourth gas supply pipe 249a are connected to the common gas supply pipe 242.

The first gas (e.g., $H_2$ gas) is supplied mainly by the first gas supply system 243 including the first gas supply pipe 243a. The third gas (DS gas) is supplied mainly by the third gas supply system 245 including the third gas supply pipe 245a. The fourth gas ($NH_3$ gas) is supplied mainly by the fourth gas supply system 249 including the fourth gas supply pipe 244a.

<Film-Forming Step S306>

Next, the film-forming step S306 will be described with reference to FIG. 13. Upon completion of the reduction step S304, the DS gas is supplied to the processing space 201 by the third gas supply system 245. DS gas is thermally decomposed and supplied onto the wafer 200 (S502).

The DS gas is thermally decomposed into a gas containing a silicon component. The silicon component from the decomposed DS gas reacts with the exposed portion of at least copper-containing film 2005 and bonds with copper. The silicon component also reacts with the side surface 2002a of the inter-wire insulating film 2002 and the surface 2001a of the insulating film 2001. As a result, the silicon-containing film 2010 is formed on the side surface 2002a of the inter-wire insulating film 2002 and the surface 2001a of the insulating film 2001 by the CVD reaction.

As described above, by forming the silicon-containing film 2010 on the exposed portion of the copper-containing film 2005, the diffusion of the copper component into the upper layer may be suppressed. According to the second embodiment, the silicon-containing film 2010 having a higher physical strength than that of the first embodiment may be formed since the film having a desired thickness is formed on the surface 2001a and the side surface 2002a by the CVD reaction. According to the second embodiment, the film having the desired thickness may be formed in a shorter time compared to the first embodiment, thereby improving the throughput.

The time duration of supplying the gas according to the second embodiment will be described. Since the silicon-containing film 2010 is formed on the surface 2001a and the side surface 2002a by the CVD reaction, the recess 2009 may be filled with silicon-containing film 2010 in case of prolonged time duration of supplying the gas. Thus, it is preferable that the time duration of supplying the gas according to the second embodiment is a few seconds, i.e. time duration suitable for securing the width L of the recess 2009.

When a predetermined time elapses, the supply of DS gas is stopped and the film-forming step S306 is completed.

In the film-forming step S306 in accordance with the second embodiment, the inner pressure of the processing space 201 ranges, for example, from 1 Pa to 10 Pa, and the temperature of the wafer 200 ranges, for example, from 150 to 400° C. The flow rate of the hydrogen-containing gas ranges, for example, from 1000 sccm to 3000 sccm, and the flow rate of the silicon-containing gas ranges, for example, from 10 sccm to 30 sccm. The time duration of supplying gas to the wafer 200 ranges, for example, from 1 second to 5 seconds.

As described above, the formation of the silicon-containing film in accordance with the first embodiment is simpler compared to the first embodiment. The silicon-containing film may be formed with high throughput on the exposed portion of the copper-containing film 2005, the side surface 2002a of the inter-wire insulating film 2002 and the surface 2001a of the insulating film 2001.

Figure 10:
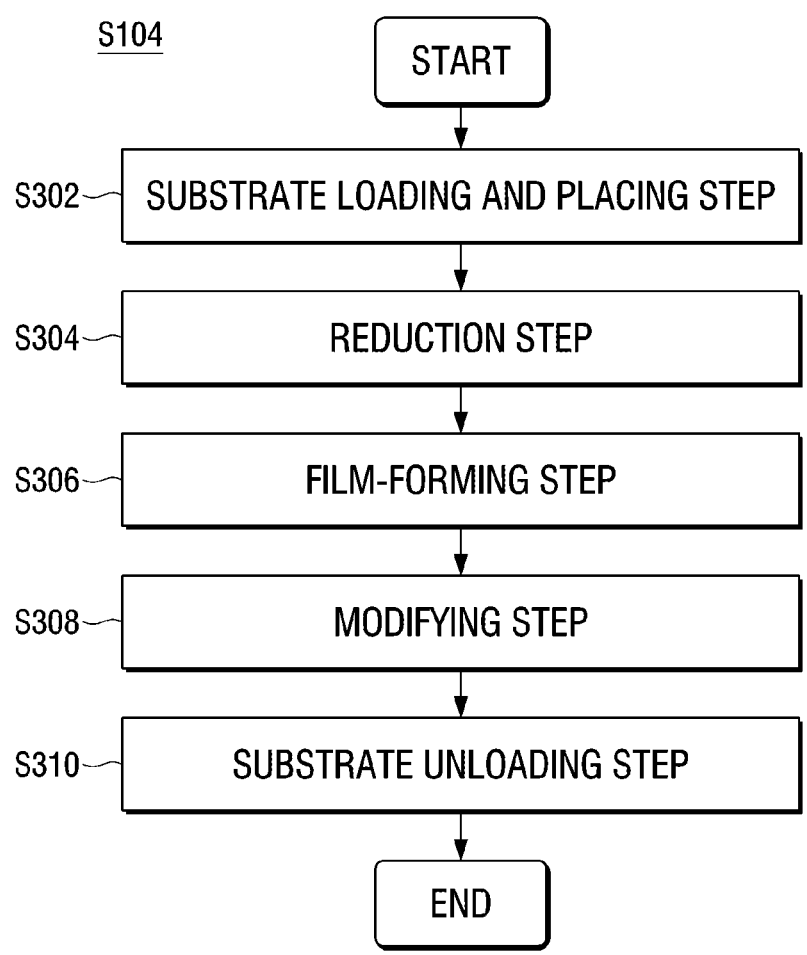
FIG. 10 illustrates a process of forming a second diffusion barrier film according to the first embodiment.

As shown in FIG. 10, when the film-forming step S306 is completed, the modifying step S308 is performed.

<Main Effects>

The main effects of the second embodiment are as follows.

(a) By forming the second diffusion barrier film 2011, the diffusion of the metal component into the upper layer may be suppressed even when the copper-containing film 2005 is exposed in the etching step.

(b) By forming the second diffusion barrier film 2011, the short-circuiting between the adjacent carbon-containing films 2005 may be prevented even when the copper-containing film 2005 is exposed in the etching step.

(c) The physical strength of the structure constituting the recess 2009 can be increased by forming the second diffusion barrier film 2011 on at least the exposed portion of the copper-containing film 2005, the side surface 2002a of the inter-wire insulating film 2002 and the surface 2001a of the insulating film 2001.

(c) Since a high strength film may be formed, the resistance to the film stress may be increased.

(d) The productivity is improved since the silicon-containing film may be formed with high throughput.

According to the technique described here, it is possible to provide a technique capable of providing superior characteristics even in a semiconductor device having an air gap.

What is claimed is:

1. A method of manufacturing a semiconductor device, comprising:
   (a) loading into a process chamber a substrate comprising: a wiring layer comprising a first interlayer insulating film, a plurality of copper-containing films formed on the first interlayer insulating film and used as a wiring, an inter-wire insulating film electrically insulating the plurality of copper containing film and a recess formed between the plurality of copper-containing film; and a first diffusion barrier film formed on a first portion of a surface of the plurality of copper-containing films to suppress a diffusion of a component of the plurality of copper-containing film;
   (b) supplying a first silicon-containing gas containing chlorine and silicon into the process chamber to form a first silicon-containing film containing chlorine and silicon on: a surface of the recess; and a second portion of the surface of the plurality of copper-containing films other than the first portion where the first diffusion barrier film is formed;
   (c) supplying a second silicon-containing gas containing hydrogen and silicon into the process chamber after performing (b) to form a second silicon-containing film, wherein the second silicon-containing gas is different from the first silicon-containing gas, chlorine is removed from the first silicon-containing film by attaching hydrogen to chlorine in the first silicon-containing film, and silicon is attached to the first silicon-containing film in place of chlorine removed by hydrogen; and
   (d) supplying a modifying gas into the process chamber after performing (c) to form a second diffusion barrier film by modifying the second silicon-containing film to suppress the diffusion of the component of the plurality of copper-containing films from the second portion, wherein the substrate is maintained at a temperature whereat a diffusion of silicon contained in the second silicon-containing film into the plurality of copper-containing films is suppressed.

2. The method of claim 1, wherein the modifying gas nitrides the second silicon-containing film in (d).

3. The method of claim 2, wherein the second silicon-containing film is nitrided by a nitrogen-containing gas in plasma state in (d).

4. The method of claim 1, wherein (b) and (c) are repeated.

5. The method of claim 1, further comprising:
   (e) forming a second interlayer insulating film on the wiring layer; and
   (f) polishing the second interlayer insulating film.

* * * * *